(12) United States Patent
Inaba et al.

(10) Patent No.: US 12,066,657 B2
(45) Date of Patent: Aug. 20, 2024

(54) OPTICAL MODULE

(71) Applicant: FURUKAWA ELECTRIC CO., LTD., Tokyo (JP)

(72) Inventors: Yusuke Inaba, Tokyo (JP); Junichi Hasegawa, Tokyo (JP); Maiko Ariga, Tokyo (JP); Kazuki Yamaoka, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 52 days.

(21) Appl. No.: 17/393,957

(22) Filed: Aug. 4, 2021

(65) Prior Publication Data

US 2021/0364697 A1 Nov. 25, 2021

Related U.S. Application Data

(63) Continuation of application No. PCT/JP2020/004095, filed on Feb. 4, 2020.

(30) Foreign Application Priority Data

Feb. 8, 2019 (JP) ................................. 2019-021916

(51) Int. Cl.
*G02B 6/12* (2006.01)
*G02B 6/293* (2006.01)
(Continued)

(52) U.S. Cl.
CPC ....... *G02B 6/12007* (2013.01); *G02B 6/1203* (2013.01); *G02B 6/29398* (2013.01);
(Continued)

(58) Field of Classification Search
CPC .............. G02B 6/12007; G02B 6/1203; G02B 6/29338; G02B 6/29352; G02B 6/29398;
(Continued)

(56) References Cited

U.S. PATENT DOCUMENTS 7,046,868 B2 * 5/2006 Terashima ........... G02B 6/4243
385/52
7,539,369 B2 * 5/2009 Yamazaki .......... G02B 6/12007
385/32
(Continued)

FOREIGN PATENT DOCUMENTS

| CN | 101286619 A | 10/2008 |
| CN | 103926662 A | 7/2014 |

(Continued)

OTHER PUBLICATIONS

Combined Chinese Office Action and Search Report issued Oct. 12, 2022, in corresponding Chinese Patent Application No. 202080012889.9 (with English Translation and English Translation of Category of Cited Documents), 18 pages.
(Continued)

*Primary Examiner* — Ryan A Lepisto
(74) *Attorney, Agent, or Firm* — Oblon, McClelland, Maier & Neustadt, L.L.P.

(57) ABSTRACT

An optical module includes: a substrate and a waveguide element having a mount face opposed to the substrate, the waveguide element having an interference waveguide portion having an optical interference function. Further, the mount face includes a projection region to which the interference waveguide portion is projected on the mount face and a non-projection region, and the waveguide element is joined to the substrate with a joint material in the non-projection region.

8 Claims, 10 Drawing Sheets

(51) Int. Cl.
*G02B 6/42* (2006.01)
*H01S 5/0239* (2021.01)

(52) U.S. Cl.
CPC ......... *G02B 6/4228* (2013.01); *G02B 6/4244* (2013.01); *G02B 6/426* (2013.01); *H01S 5/0239* (2021.01); *G02B 6/29338* (2013.01); *G02B 6/29352* (2013.01); *G02B 6/4286* (2013.01)

(58) Field of Classification Search
CPC .. G02B 6/4215; G02B 6/4228; G02B 6/4244; G02B 6/426; G02B 6/4286; H01S 5/0239
See application file for complete search history.

(56) References Cited

U.S. PATENT DOCUMENTS

| | | | | |
|---|---|---|---|---|
| 9,116,317 | B2* | 8/2015 | Nasu | G02B 6/12004 |
| 9,201,194 | B2* | 12/2015 | Ooba | G02B 6/12 |
| 11,460,650 | B2* | 10/2022 | Miyazaki | G02B 6/4286 |
| 2002/0110335 | A1 | 8/2002 | Wagner et al. | |
| 2008/0187268 | A1 | 8/2008 | Kaneko et al. | |
| 2010/0086261 | A1 | 4/2010 | Tanaka | |
| 2012/0070113 | A1* | 3/2012 | Ishii | G02B 6/12007 228/164 |
| 2014/0193114 | A1 | 7/2014 | Ooba et al. | |
| 2016/0223881 | A1* | 8/2016 | Doi | G02F 1/0036 |

FOREIGN PATENT DOCUMENTS

| | | |
|---|---|---|
| CN | 108463666 A | 8/2018 |
| JP | 59-159110 A | 9/1984 |
| JP | 2001-74972 A | 3/2001 |
| JP | 2002-352465 A | 12/2002 |
| JP | 2005-37444 A | 2/2005 |
| JP | 2008-193003 A | 8/2008 |
| JP | 2011-99928 A | 5/2011 |
| JP | 2013-205494 A | 10/2013 |
| JP | 2014-134689 A | 7/2014 |
| JP | 2014-165384 A | 9/2014 |
| JP | 2017-130508 A | 7/2017 |

OTHER PUBLICATIONS

International Search Report issued Mar. 31, 2020 in PCT/JP2020/004095, filed on Feb. 4, 2020, 3 pages.
Office Action issued Apr. 8, 2023, in Chinese Patent Application No. 202080012889.9 (with English-language translation), 20 pages.

* cited by examiner (a)

(b)

OPTICAL MODULE

CROSS-REFERENCE TO RELATED APPLICATION(S)

This application is a continuation of International Application No. PCT/JP2020/004095, filed on Feb. 4, 2020 which claims the benefit of priority of the prior Japanese Patent Application No. 2019-021916, filed on Feb. 8, 2019, the entire contents of which are incorporated herein by reference.

BACKGROUND

The present disclosure relates to an optical module.

An optical module used in optical communication, etc. is provided with an optical element configured to subject input light to a predetermined action and output the light. As the optical element, for example, a waveguide element having an interference waveguide portion is used. The interference waveguide portion includes a waveguide and is a part having an optical interference function of subjecting the input light to interference (Japanese Laid-open Patent Publication No. 2014-165384).

SUMMARY

There is a need for providing an optical module in which changes in the optical characteristics of the waveguide element or the optical element caused by the stress from the substrate can be suppressed According to an embodiment, an optical module includes: a substrate and a waveguide element having a mount face opposed to the substrate, the waveguide element having an interference waveguide portion having an optical interference function. Further, the mount face includes a projection region to which the interference waveguide portion is projected on the mount face and a non-projection region, and the waveguide element is joined to the substrate with a joint material in the non-projection region.

According to an embodiment, an optical module includes: a substrate and an optical element having a mount face opposed to the substrate, the optical element configured to subject input light to a predetermined action and output the light. Further, the mount face includes a projection region to which an optical path of the light in the optical element is projected on the mount face and a non-projection region, and the optical element is joined to the substrate with a joint material in the non-projection region.

According to an embodiment, an optical module includes: a substrate and an optical element having a mount face opposed to the substrate, the optical element configured to subject input light to a predetermined action and output the light. Further, the optical element is joined to the substrate by the mount face with a plurality of joint materials mutually separated from each other.

DETAILED DESCRIPTION

In the related art, the waveguide element or the optical element is joined to a substrate with a joint material and mounted on a mount face opposed to the substrate. In this case, when a whole surface of the mount face of the waveguide element or the optical element is joined to the substrate with the joint material, the waveguide element or the optical element is distorted by the stress from the substrate, and optical characteristics of the waveguide element or the optical element are sometimes changed.

Hereinafter, embodiments of the present disclosure will be described in detail with reference to accompanying drawings. Note that the present disclosure is not limited by the embodiments described below. Further, in the description of the drawings, the same or corresponding elements are appropriately denoted by the same reference signs, and redundant description is appropriately omitted. Further, it should be noted that the drawings are schematic and that the dimensional relations of elements, ratios of the elements, etc. are sometimes different from reality.

First Embodiment

Figure 1:
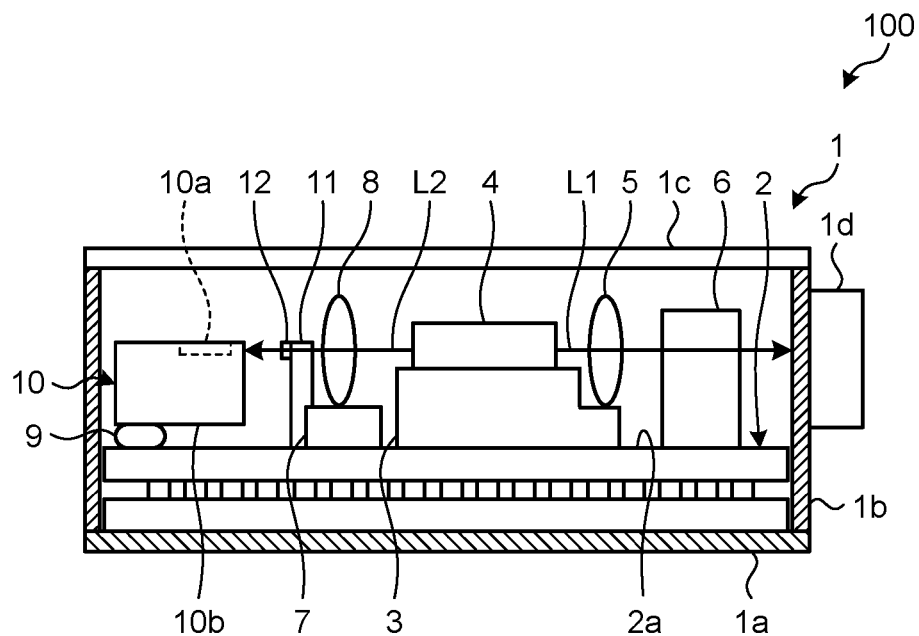
FIG. 1 is a schematic partially-cutaway lateral view of an optical module according to a first embodiment.

FIG. 1 is a schematic partially-cutaway lateral view of an optical module according to a first embodiment. This optical module 100 is provided with a housing 1. The housing 1 is provided with a bottom plate portion 1a, a lateral wall portion 1b, an upper cover portion 1c, and an optical output unit 1d. The bottom plate portion 1a is a plate-like member. The lateral wall portion 1b is a frame-plate-like member having four faces, and each of the faces is approximately orthogonal to the bottom plate portion 1a. The upper cover portion 1c is a plate-like member disposed to be opposed to the bottom plate portion 1a. The optical output unit 1d is a round-tube-like member and is provided on one of the faces of the lateral wall portion 1b. The lateral wall portion 1b is provided with a translucent window, and light can pass through the window and the optical output unit 1d from inside the housing 1.

The bottom plate portion 1a includes a material having high thermal conductivity such as copper tungsten (CuW), copper molybdenum (CuMo), or alumina ($Al_2O_3$). The lateral wall portion 1b, the upper cover portion 1c, and the optical output unit 1d include a material having a low thermal expansion coefficient such as an Fe—Ni—Co alloy or alumina.

The interior of the optical module 100 houses following components: a thermoelectric cooling element (TEC) 2, a carrier 3, a semiconductor laser element 4, a lens 5, an optical isolator 6, a lens holder 7, a lens 8, a waveguide element 10, a light-receiving-element holder 11, and a light-receiving-element unit 12.

The optical module 100 is configured in a manner that these components are mounted in the housing 1 and that the upper cover portion 1c is attached thereto and seals it in an airtight manner.

The optical module 100 is configured as a semiconductor laser module. Hereinafter, configurations and functions of the components will be described.

Thermoelectric cooling element 2 is fixed to the bottom plate portion 1a. The thermoelectric cooling element 2 is supplied with power from outside via an unillustrated lead and carries out heat absorption or heat generation depending on the direction of the flow of a current. In the present embodiment, the thermoelectric cooling element 2 is a publicly-known Peltier module and has a configuration in which a semiconductor device is disposed between two insulative substrates. The substrate in the side of the upper cover portion 1c between the two substrates is a substrate 2a. Note that the two substrates include, for example, at least one of aluminum nitride, alumina, and silicon nitride ($Si_3N_4$) which are ceramics. The two substrates may be aluminum nitride substrates, alumina substrates, or silicon nitride substrates.

The carrier 3, the semiconductor laser element 4, the lens 5, the optical isolator 6, the lens holder 7, the lens 8, the waveguide element 10, the light-receiving-element holder 11, and the light-receiving-element unit 12 are mounted on the substrate 2a of the thermoelectric cooling element 2. These components are controlled to a desired temperature by causing a current to flow through the thermoelectric cooling element 2.

The semiconductor laser element 4 is mounted on the carrier 3 and is, for example, a wavelength-tunable laser element. The carrier 3 is also called a sub mount, includes an insulative material having a high thermal conductivity, and efficiently transmits the heat generated by the semiconductor laser element 4 to the thermoelectric cooling element 2.

The semiconductor laser element 4 is supplied with power from outside via unillustrated lead and outputs a laser light beam L1 toward the lens 5. The wavelength of the laser light beam L1 is, for example, 900 nm or higher and 1650 nm or less, which is suitable as a wavelength of optical communication.

The lens 5 is mounted on the carrier 3. The laser light beam L1 is input to the lens 5, and the lens 5 collimates the laser light beam L1 and outputs the laser light beam.

The collimated laser light beam L1 is input to the optical isolator 6, and the optical isolator 6 allows the laser light beam L1 to pass through and outputs the laser light beam toward the optical output unit 1d. The optical isolator 6 prevents passage of the light that has advanced from the side of the optical output unit 1d. By virtue of this, the optical isolator 6 prevents reflected light, etc. from entering the semiconductor laser element 4 from outside.

The semiconductor laser element 4 outputs a laser light beam L2, which has comparatively low power, from an end facet (rear facet) in the opposite side of the end facet (output facet) which is opposed to the lens 5 and outputs laser light beam L1. The lens 8 is mounted on the lens holder 7, condenses the laser light beam L2, and outputs the laser light beam to the waveguide element 10.

The waveguide element 10 is a planar lightwave circuit element including a semiconductor such as silica-based glass or silicon. The waveguide element 10 has one ring resonator 10a as an interference waveguide portion having an optical interference function. However, the waveguide element may have a plurality of ring resonators. The ring resonator 10a is a part including a ring waveguide and two optical coupler waveguides, which inputs/outputs light to/from the ring waveguide. As the optical coupler waveguide, for example, a multimode interference waveguide type or a directional coupler can be used. Further, the waveguide element 10 has a mount face 10b, which is one of main surfaces and is opposed to the substrate 2a, is mounted on the substrate 2a in the side of the mount face 10b, and is joined to the substrate 2a with a joint material 9. The ring resonator 10a is formed in a vicinity of the face which is in the opposite side of the mount face 10b. The joint material 9 is, for example, an epoxy resin, an acrylic resin, a rubber adhesive agent, a silicone resin adhesive agent, or solder.

The ring resonator 10a periodically changes transmission characteristics with respect to wavelengths. The waveguide element 10 divides the input the laser light beam L2 into two, outputs one of them, and causes the other one to transmit through the ring resonator 10a and be output.

The light-receiving-element unit 12 is mounted on the light-receiving-element holder 11 and is provided with two light receiving elements. The two light receiving elements respectively receive two rays of the laser light beams output from the waveguide element 10. Current signals output respectively from the two light receiving elements are output to an external controller and are used for wavelength control of the laser light beam L1 like a publicly known technique.

Figure 2:
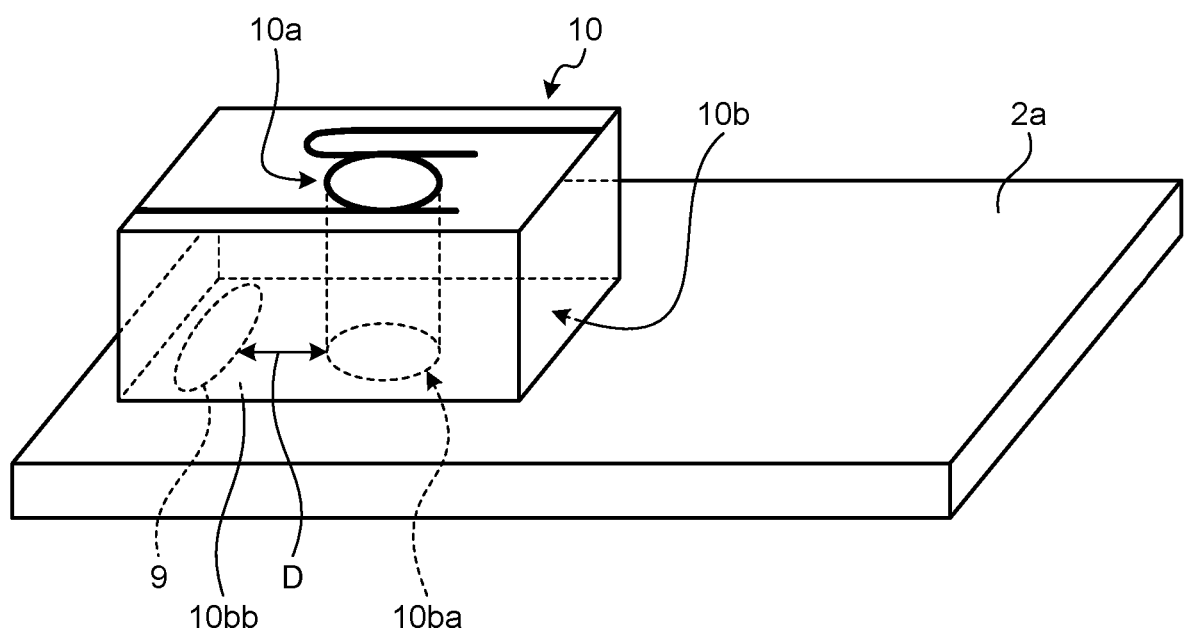
FIG. 2 is a schematic diagram describing a mount state of a waveguide element.

As illustrated in FIG. 2, the mount face 10b includes a projection region 10ba, which is a region in which the ring resonator 10a is projected on the mount face 10b, and a non-projection region 10bb, which is a region other than the projection region 10ba. The projection region 10ba is the region to which the waveguides constituting the ring resonator 10a is projected. Therefore, for example, the region surrounded by the projection region of the ring waveguide is not the projection region 10ba, but is the non-projection region 10bb. The waveguide element 10 is joined to the substrate 2a by the joint material 9 in the non-projection region 10bb.

When the optical module 100 undergoes changes in an environmental temperature or the thermoelectric cooling element 2 carries out temperature adjustment, the joint material 9 expands or contracts; therefore, a stress is applied to the waveguide element 10. However, since the waveguide element 10 is joined to the substrate 2a in the non-projection region 10bb with the joint material 9, the stress does not easily act on the ring resonator 10a, which easily changes optical characteristics depending on the stress. As a result, changes in the optical characteristics of the waveguide element 10 caused by the stress from the substrate are suppressed.

Furthermore, the waveguide element 10 is preferred to be joined with the joint material 9 in a region which is separated from the projection region 10ba by a certain distance (a distance D in FIG. 2) in the non-projection region 10bb. By virtue of this, the stress caused by expansion or contraction of the joint material 9 does not easily act on the ring resonator 10a furthermore. The separation distance is preferred to be two times or more a waveguide width of the waveguides constituting the ring resonator 10a. The waveguide width is the width which is parallel to the ring resonator 10a and is orthogonal to the extending direction of the waveguides. Generally, the width of the wave-guided light which permeates from the waveguides is smaller than two times the waveguide width; therefore the separation distance which is two times or more the waveguide width can more reliably suppress the action of the stress on the ring resonator 10a.

As described above, in the optical module 100, changes in the optical characteristics of the waveguide element 10 caused by the stress from the substrate are suppressed. Further, when the non-projection region 10bb in the side of one of the end facets of the waveguide element 10 is fixed to the substrate like the optical module 100, an advantage that changes in the optical characteristics of the waveguide element 10 caused by the stress from the substrate can be further suppressed can be obtained.

Figure 3:
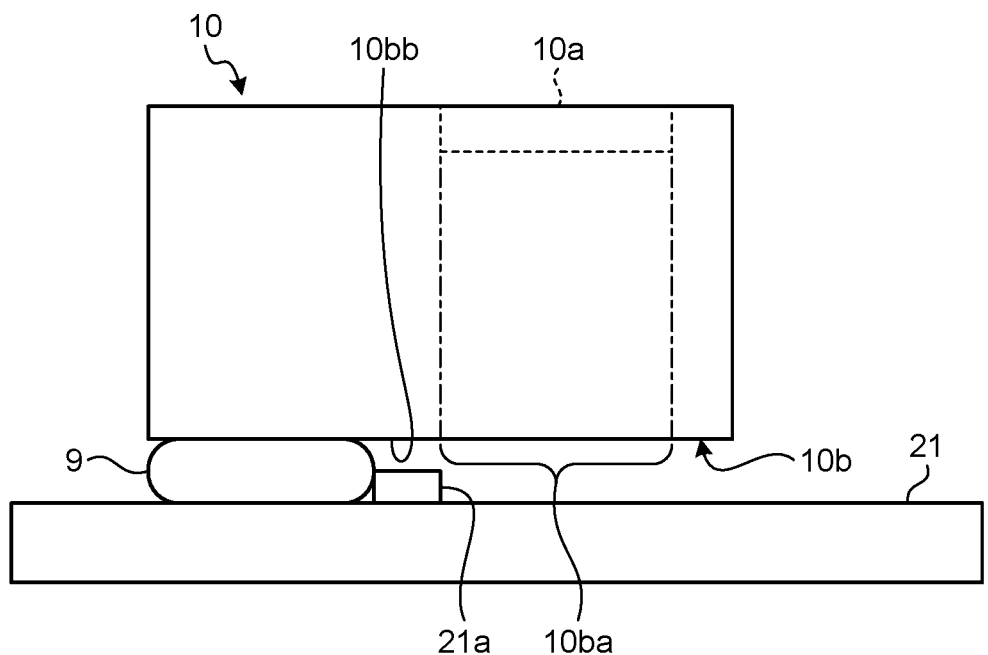
FIG. 3 is a schematic diagram describing an example of a mount state of the waveguide element.

Hereinafter, a modification example of the first embodiment will be described. FIG. 3 is a schematic diagram describing an example of a mount state of the waveguide element 10 in the optical module. This waveguide element 10 is mounted on a substrate 21, which is a replacement for the substrate 2a. The substrate 21 is provided with a metalized pattern 21a as a position controller, which positions the joint material 9 in the non-projection region. The metalized pattern 21a extends longer than the joint material 9 in a direction perpendicular to the paper plane. The joint material 9 can be positioned in the non-projection region 10bb since outflow to the projection region 10ba can be prevented by the metalized pattern 21a in a state that is in course of hardening.

Figure 4:
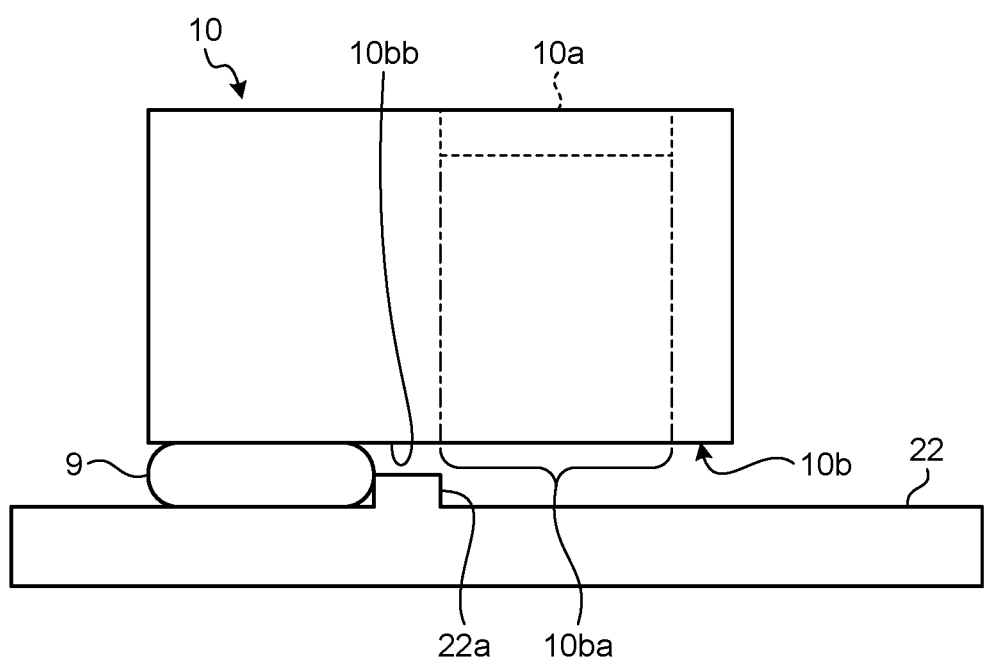
FIG. 4 is a schematic diagram describing an example of a mount state of the waveguide element.

FIG. 4 is a schematic diagram describing an example of a mount state of the waveguide element 10 in the optical module. This waveguide element 10 is mounted on a substrate 22, which is a replacement for the substrate 2a. The substrate 22 is provided with a protrusion 22a as a position controller, which positions the joint material 9 in the non-projection region. The protrusion 22a extends longer than the joint material 9 in the direction perpendicular to the paper plane. The joint material 9 can be positioned in the non-projection region 10bb since outflow to the projection region 10ba can be prevented by the protrusion 22a in a state that is in course of hardening.

Figure 5:
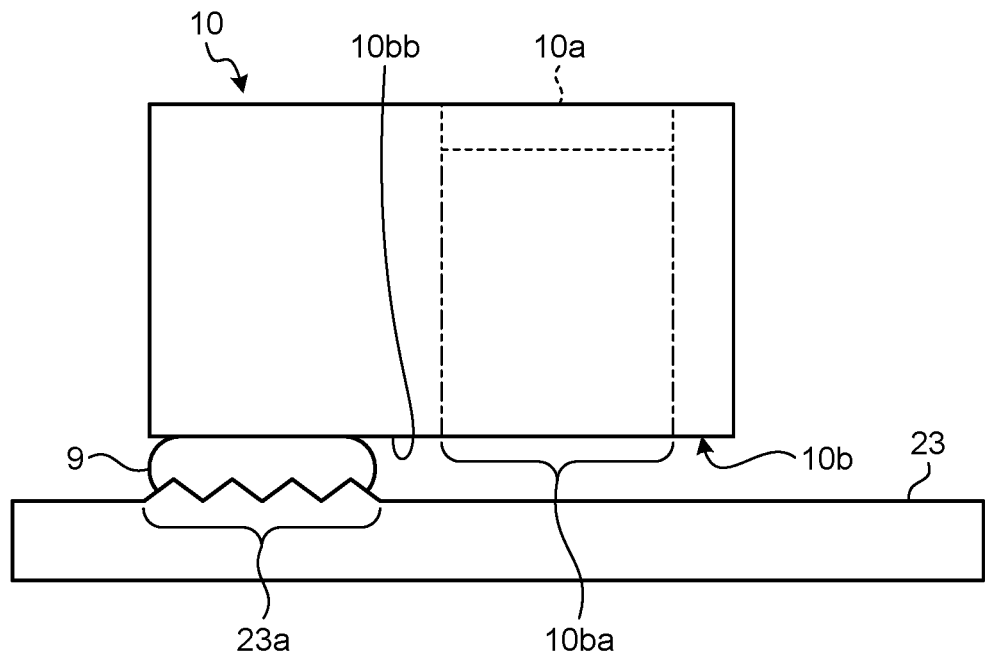
FIG. 5 is a schematic diagram describing an example of a mount state of the waveguide element.

FIG. 5 is a schematic diagram describing an example of a mount state of the waveguide element 10 in the optical module. This waveguide element 10 is mounted on a substrate 23, which is a replacement for the substrate 2a. The substrate 23 is provided with a rough surface region 23a as a position controller, which positions the joint material 9 in the non-projection region. The rough surface region 23a extends longer than the joint material 9 in the direction perpendicular to the paper plane. The joint material 9 can be positioned in the non-projection region 10bb since outflow to the projection region 10ba can be prevented as the joint material stays in the rough surface region 23a in a state that is in course of hardening.

Figure 6:
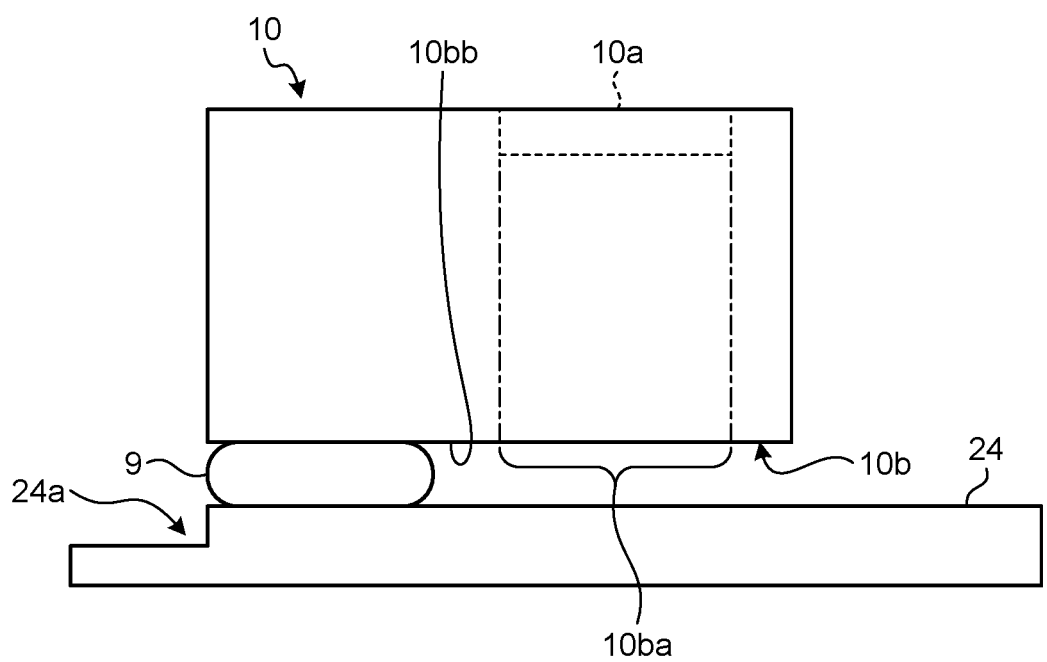
FIG. 6 is a schematic diagram describing an example of a mount state of the waveguide element.

FIG. 6 is a schematic diagram describing an example of a mount state of the waveguide element 10 in the optical module. This waveguide element 10 is mounted on a substrate 24, which is a replacement for the substrate 2a. The substrate 24 is provided with a spot facing portion 24a as a position controller, which positions the joint material 9 in the non-projection region. The spot facing portion 24a extends longer than the joint material 9 in the direction perpendicular to the paper plane. In a case in which the joint material 9 flows in a state that is in course of hardening, the joint material 9 tends to flow the spot facing portion 24a. By virtue of this, the joint material 9 can be positioned in the non-projection region 10bb since outflow to the projection region 10ba can be prevented.

Figure 7:
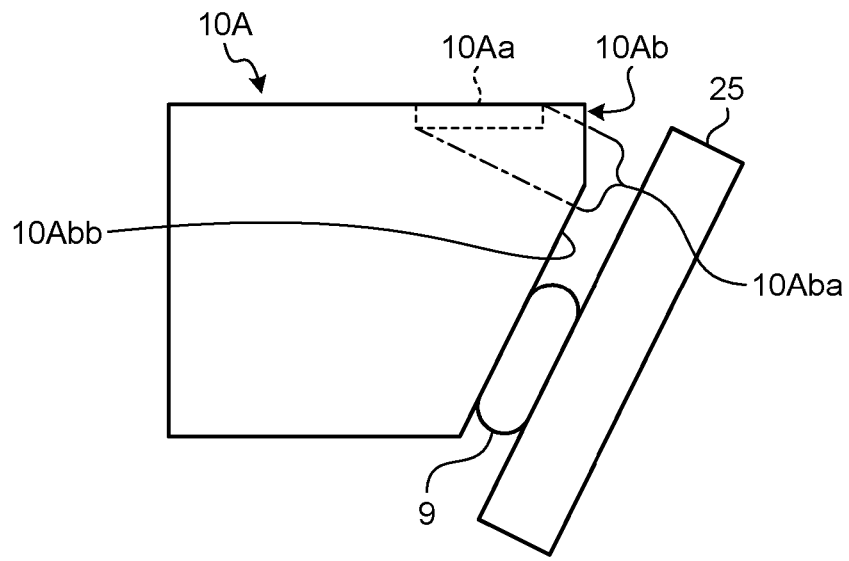
FIG. 7 is a schematic diagram describing an example of a mount state of the waveguide element.

FIG. 7 is a schematic diagram describing an example of a mount state of a waveguide element 10A in the optical module. This waveguide element 10A is provided with a ring resonator 10Aa. The waveguide element 10A has a mount face 10Ab which is not parallel to the ring resonator 10Aa. The waveguide element 10A is mounted on a substrate 25. Further, regarding this waveguide element 10A, the mount face 10Ab includes a projection region 10Aba, which is a region in which the ring resonator 10a is projected on the mount face 10b, and a non-projection region 10Abb, which is a region other than the projection region 10Aba. The waveguide element 10A is joined to the substrate 25 by the joint material 9 in the non-projection region 10Abb. By virtue of this, changes in the optical characteristics of the waveguide element 10A caused by the stress from the substrate are suppressed.

Figure 8:
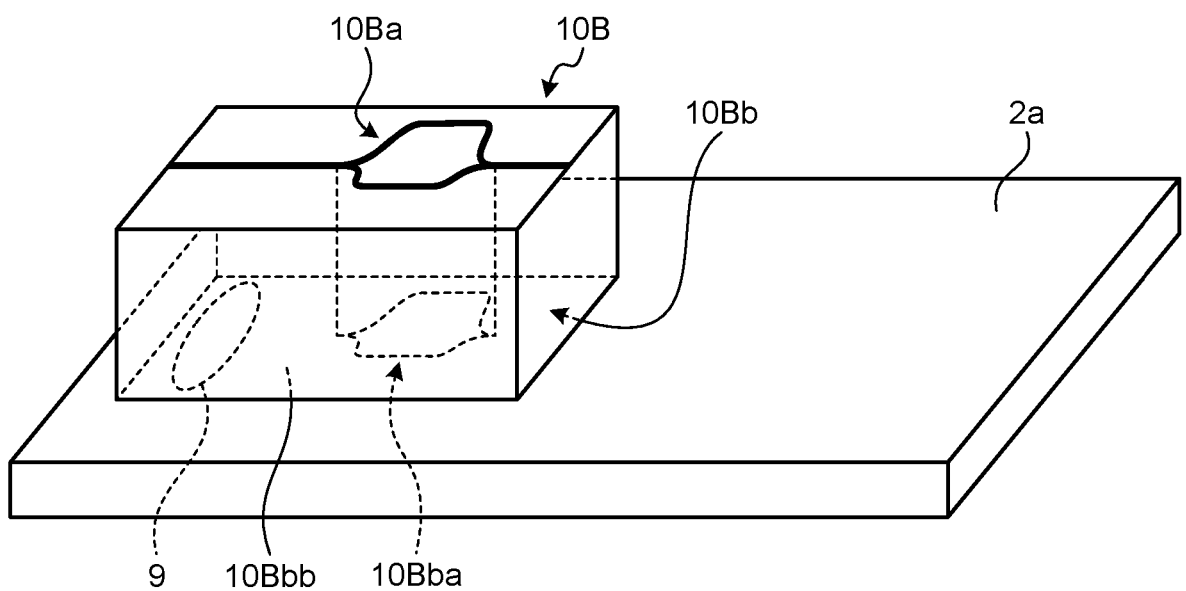
FIG. 8 is a schematic diagram describing an example of a mount state of the waveguide element.

FIG. 8 is a schematic diagram describing an example of a mount state of a waveguide element 10B in the optical module. The waveguide element 10B is a Mach-Zehnder interferometer element including a semiconductor such as silica-based glass or silicon. However, the waveguide element 10B has a single-stage Mach-Zehnder interferometer 10Ba as an interference waveguide portion, which has an optical interference function. However, the waveguide element may have a plurality of Mach-Zehnder interferometers. The Mach-Zehnder interferometer 10Ba is a part including two optical coupler waveguides and an arm waveguide connected to the two optical coupler waveguides. The waveguide element 10B has a mount face 10Bb, which is one of main surfaces and is opposed to the substrate 2a, is mounted on the substrate 2a in the side of the mount face 10Bb, and is joined to the substrate 2a with a joint material 9. The Mach-Zehnder interferometer 10Ba is formed in a vicinity of the face which is in the opposite side of the mount face 10Bb.

The mount face 10Bb includes a projection region 10Bba, which is a region in which the Mach-Zehnder interferometer 10Ba is projected on the mount face 10Bb, and a non-projection region 10Bbb, which is a region other than the projection region 10Bba. The waveguide element 10B is joined to the substrate 2a by the joint material 9 in the non-projection region 10Bbb. By virtue of this, changes in the optical characteristics of the waveguide element 10 caused by the stress from the substrate are suppressed.

Furthermore, the waveguide element 10B is preferred to be joined with the joint material 9 in a region which is separated from the projection region 10Bba by a certain distance in the non-projection region 10Bbb. The separation distance is preferred to be two times or more a waveguide width of the waveguides constituting the Mach-Zehnder interferometer 10Ba.

Second Embodiment

An optical module according to a second embodiment can suppress changes in the optical characteristics caused by the stress from the substrate regarding an optical element other than a waveguide element.

Figure 9:
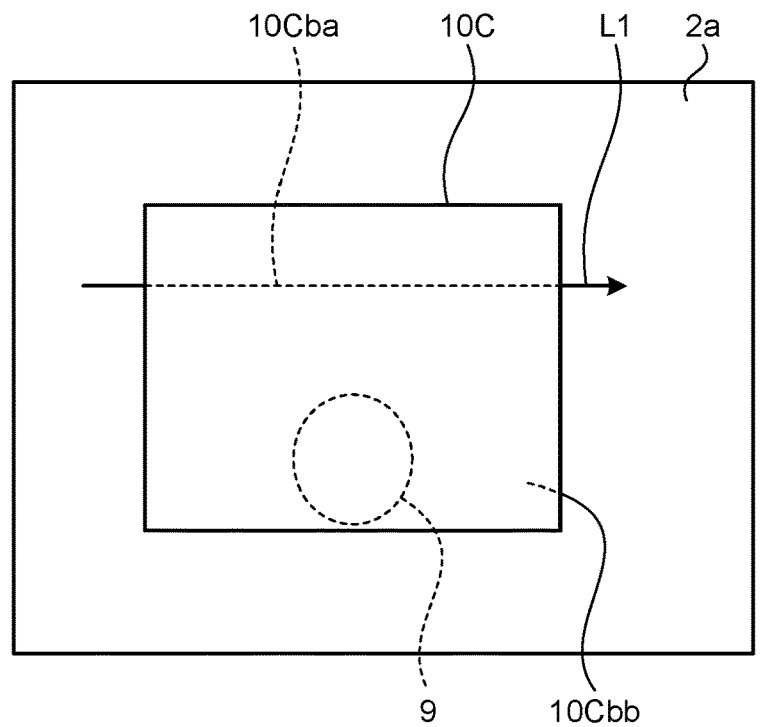
FIGS. 9 illustrates schematic diagrams describing an example of a mount state of an optical element.
Figure 9:
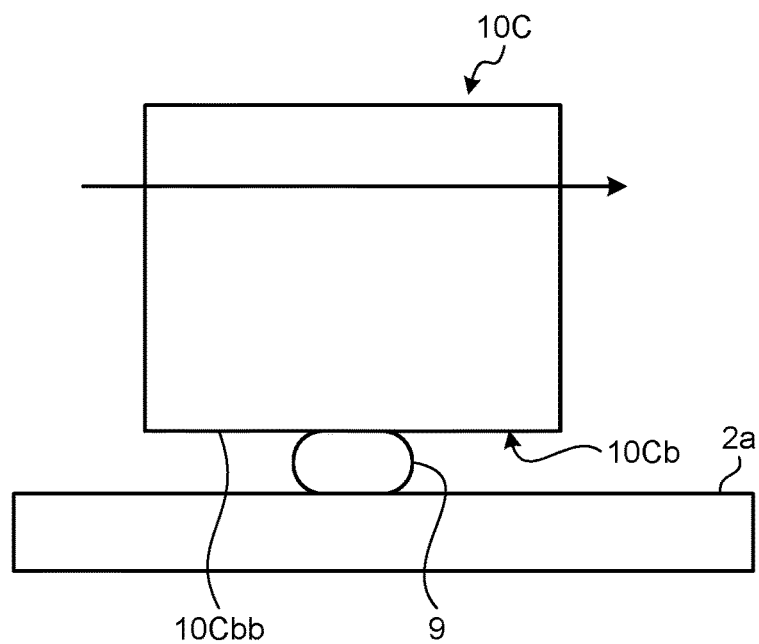

FIG. 9 is schematic diagrams describing an example of a mount state of an optical element of an optical module. Part (a) of FIG. 9 is a top view, and part (b) of FIG. 9 is a lateral view.

An optical element 10C is an etalon filter. The optical element 10C periodically changes transmission characteristics with respect to wavelengths and allows the input the laser light beam L1 to transmit through at the transmittance corresponding to the wavelength thereof. The optical element 10C has a mount face 10Cb, which is one of main surfaces and is opposed to the substrate 2a, is mounted on the substrate 2a in the side of the mount face 10Cb, and is joined to the substrate 2a with a joint material 9.

The mount face 10Cb includes a projection region 10Cba, which is a region in which an optical path of the laser light beam L1 is projected on the mount face 10Cb, and a non-projection region 10Cbb, which is a region other than the projection region 10Cba. The projection region 10Cba has a width equal to a beam diameter of the laser light beam L1. The beam diameter can be $1/e^2$ the full width of the beam profile of the laser light beam L1. The optical element 10C is joined to the substrate 2a with the joint material 9 in the non-projection region 10Cbb.

Since the optical element 10C is joined to the substrate 2a in the non-projection region 10Cbb with the joint material 9, changes in the optical characteristics caused by the stress from the substrate (for example, changes in transmission characteristics) can be suppressed. Furthermore, the optical element 10C is preferred to be joined with the joint material 9 in a region which is separated from the projection region 10Cba by a certain distance in the non-projection region 10Cbb. By virtue of this, the stress caused by expansion or contraction of the joint material 9 does not easily act on the optical element 10C furthermore. The separation distance is preferred to be two times or more the beam diameter of the laser light beam L1.

Figure 10:
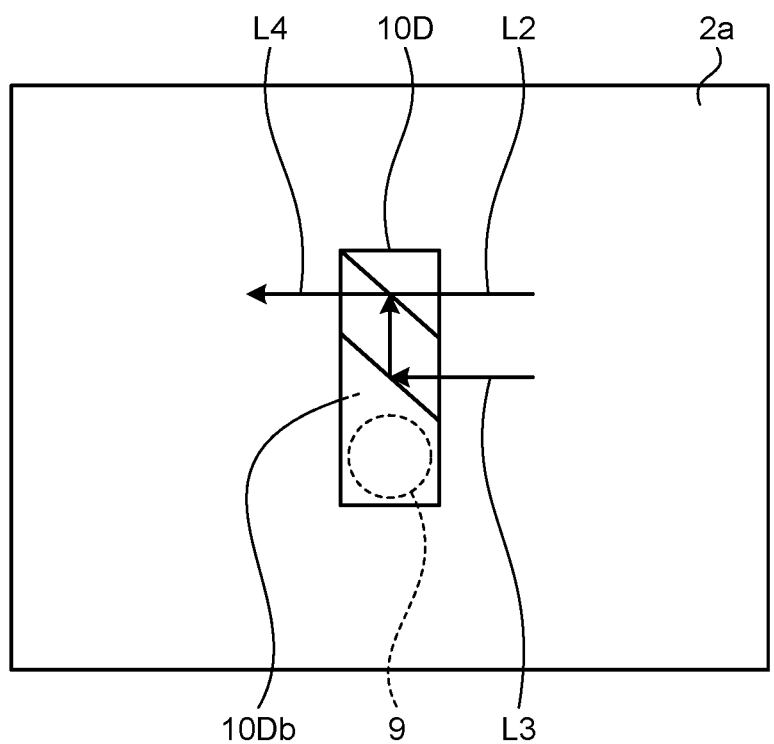
FIG. 10 is a schematic diagram describing an example of a mount state of an optical element.

FIG. 10 is a schematic diagram describing an example of a mount state of an optical element 10D in an optical module. The optical element 10D is a polarized-wave combiner/splitter. When light of linearly polarized waves which are orthogonal to each other is input, the optical element 10D subjects the light to polarized wave synthesis and outputs the light or subjects the input light to polarized wave separation into light of linearly polarized waves, which are orthogonal to each other, and outputs the light. FIG. 10 illustrates an example in which input the laser light beams L2 and L3 is subjected to polarized wave synthesis and output as a laser light beam L4. The optical element 10D has a mount face 10Db, which is one of main surfaces and is opposed to the substrate 2a, is mounted on the substrate 2a in the side of the mount face 10Db, and is joined to the substrate 2a with the joint material 9.

The mount face 10Db includes a projection region, which is a region in which optical paths of the laser light beams L2, L3, and L4 are projected on the mount face 10Db, and a non-projection region, which is a region other than the projection region. The projection region has a width equal to a beam diameter of the laser light beams L2, L3, and L4. The optical element 10D is joined to the substrate 2a with the joint material 9 in the non-projection region.

Since the optical element 10D is joined to the substrate 2a in the non-projection region with the joint material 9, changes in the optical characteristics caused by the stress from the substrate (for example, deterioration in the loss in the polarized wave synthesis or deterioration in the polarization extinction ratio in the polarized wave separation) can be suppressed.

Third Embodiment

An optical module according to a third embodiment can suppress changes in the optical characteristics caused by the stress from a substrate of an optical element.

Figure 11:
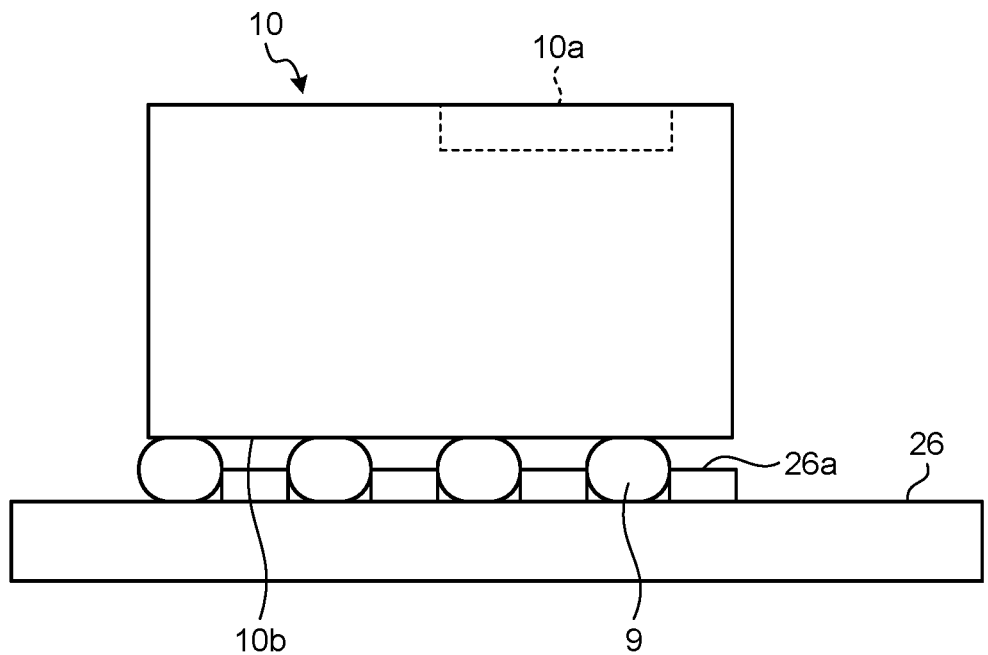
FIG. 11 is a schematic diagram describing an example of a mount state of the waveguide element.

FIG. 11 is a schematic diagram describing an example of a mount state of the waveguide element 10, which is an optical element in the optical module. The waveguide element 10 has a ring resonator 10a and a mount face 10b opposed to a substrate 26. The waveguide element 10 is joined to the substrate 26 with a plurality of joint materials 9, which are mutually separated, on the mount face 10b. The substrate 26 is a replacement for the substrate 2a. By virtue of this, the stress exerted individually by each of the joint materials 9 on the waveguide element 10 is reduced, and changes in the optical characteristics of the waveguide element 10 caused by the stress from the substrate are therefore suppressed. The size of each joint material 9 can be set so that changes in the optical characteristics of the waveguide element 10 caused by the stress from the substrate are equal to or lower than an acceptable degree or lower.

Herein, the substrate 26 is provided with a metalized pattern 26a as a position controller, which positions the joint materials 9 so that the joint materials are mutually separated. The metalized pattern 26a extends longer than the joint material 9 in a direction perpendicular to the paper plane. By virtue of the metalized pattern 21a, the joint materials 9 can maintain a state in which the joint materials are mutually separated even in a state that is in course of hardening.

Figure 12:
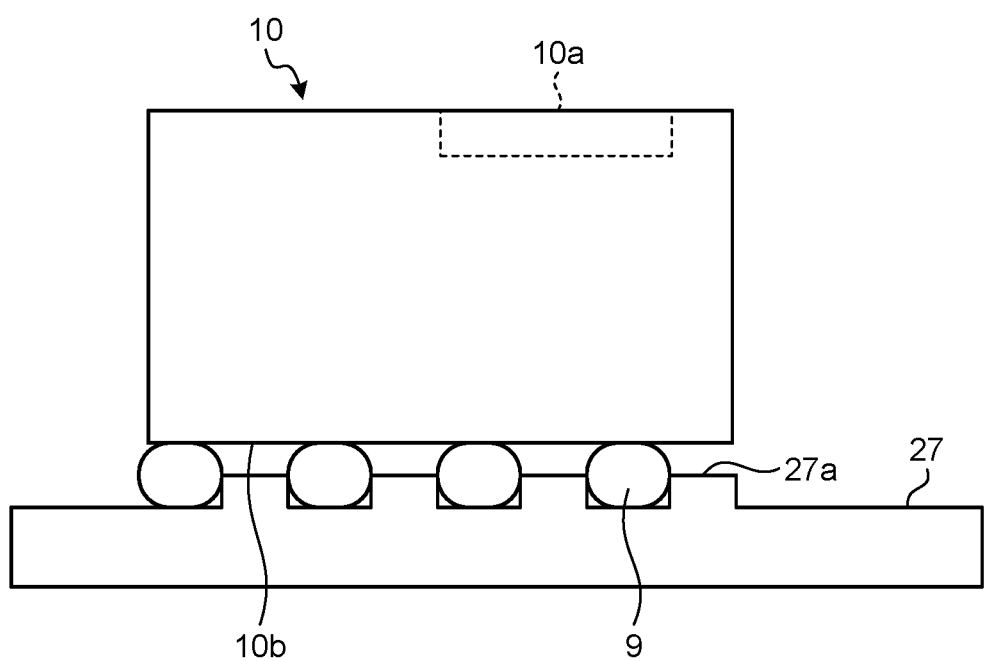
FIG. 12 is a schematic diagram describing an example of a mount state of the waveguide element.

FIG. 12 is a schematic diagram describing an example of a mount state of the waveguide element 10 in the optical module. This waveguide element 10 is mounted on a substrate 27, which is a replacement for the substrate 2a. The substrate 27 is provided with protrusions 27a as position controllers, which position the joint materials 9 so that the joint materials are mutually separated. The protrusions 27a extend longer than the joint materials 9 in the direction perpendicular to the paper plane. By virtue of the protrusions 27a, the joint materials 9 can maintain a state in which the joint materials are mutually separated even in a state that is in course of hardening.

Figure 13:
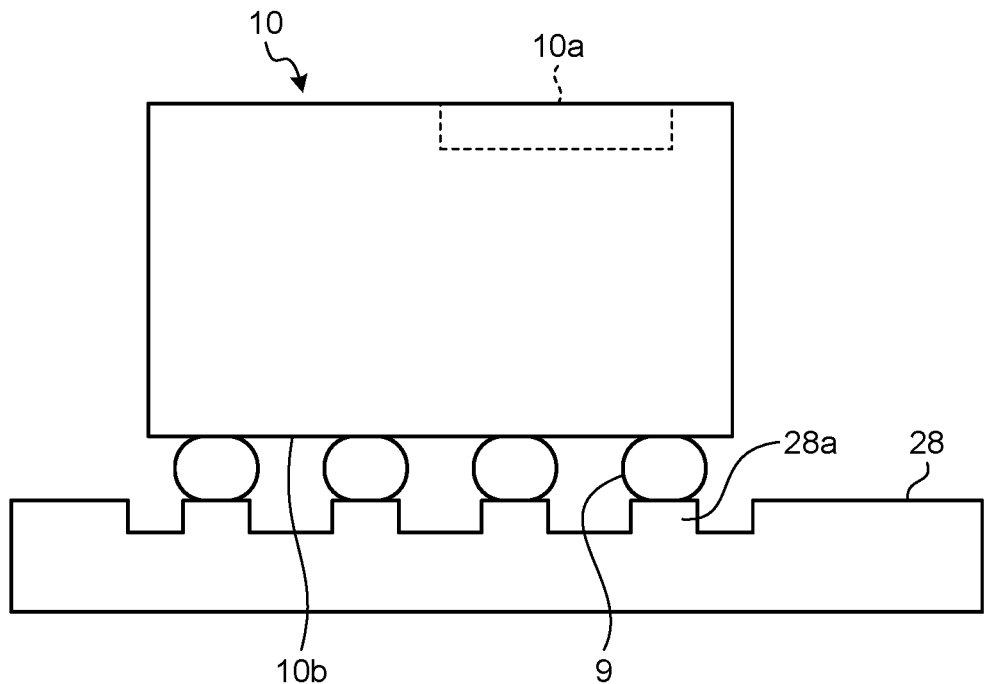
FIG. 13 is a schematic diagram describing an example of a mount state of the waveguide element.

FIG. 13 is a schematic diagram describing an example of a mount state of the waveguide element 10 in the optical module. This waveguide element 10 is mounted on a substrate 28, which is a replacement for the substrate 2a. The substrate 28 is provided with spot facing portions 28a as position controllers, which position the joint materials 9 so that the joint materials are mutually separated. The spot facing portions 28a extend longer than the joint materials 9 in the direction perpendicular to the paper plane. By virtue of the spot facing portions 28a, even if the joint material 9 flows out in a state that is in course of hardening, the spot facing portion 28a prevents the joint material 9 from reaching the adjacent joint material 9, and the mutually separated state is maintained.

Figure 14:
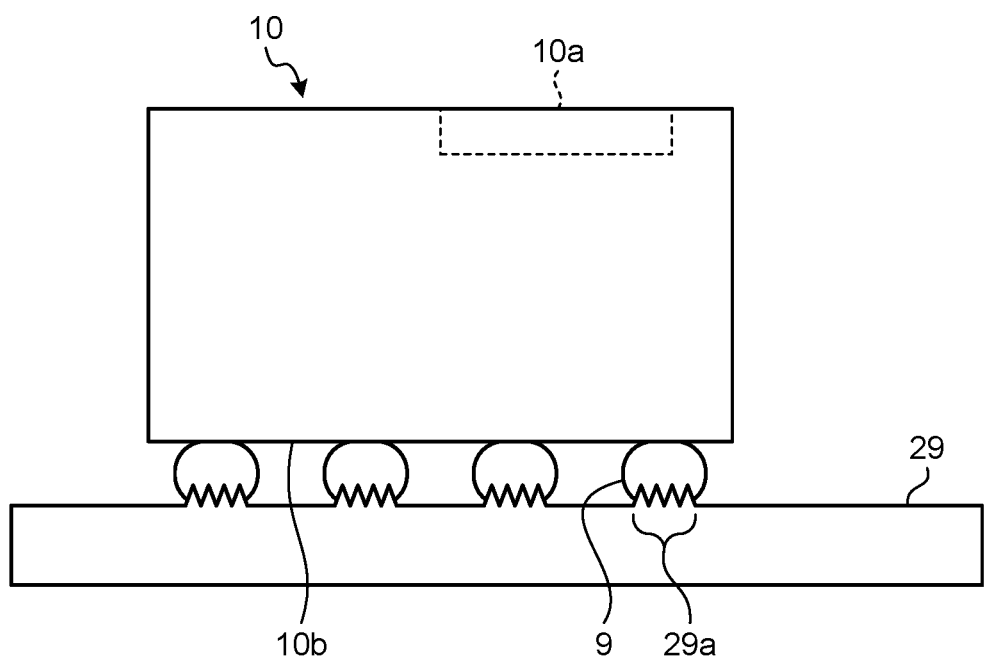
FIG. 14 is a schematic diagram describing an example of a mount state of the waveguide element.
Figure 15A:
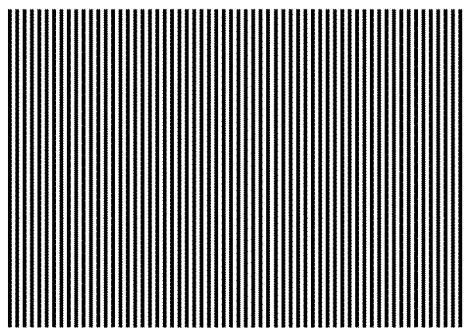
FIG. 15A is a schematic diagram describing an example of a pattern.
Figure 15B:
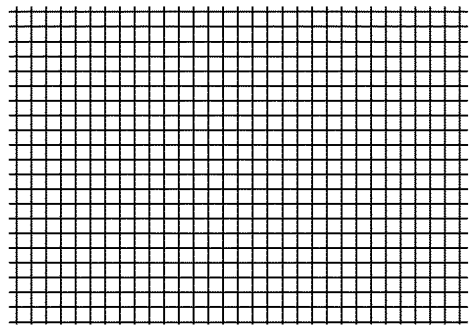
FIG. 15B is a schematic diagram describing an example of a pattern.
Figure 15C:
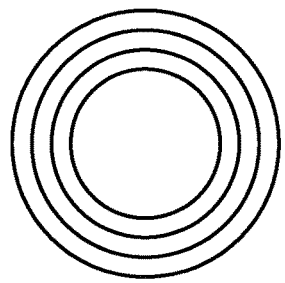
FIG. 15C is a schematic diagram describing an example of a pattern.
Figure 15D:
FIG. 15D is a schematic diagram describing an example of a pattern.
Figure 15E:
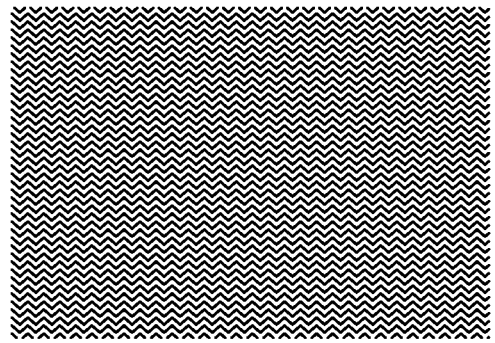
FIG. 15E is a schematic diagram describing an example of a pattern.
Figure 15F:
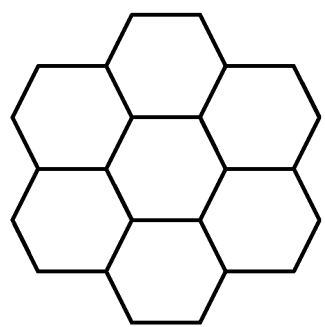
FIG. 15F is a schematic diagram describing an example of a pattern.

FIG. 14 is a schematic diagram describing an example of a mount state of the waveguide element 10 in the optical module. This waveguide element 10 is mounted on a substrate 29, which is a replacement for the substrate 2a. The substrate 29 is provided with rough surface regions 29a as position controllers, which position the joint materials 9 so that the joint materials are mutually separated. The rough surface regions 29a extend longer than the joint material 9 in the direction perpendicular to the paper plane. Since each of the joint materials 9 stays on the rough surface region 29a in a state that is in course of hardening, the mutually separated state is maintained.

The metalized pattern 26a, the protrusions 27a, the spot facing portions 28a, and the rough surface regions 29a, which are position controllers, are formed in, for example, strip shapes, lattice shapes, concentric circular shapes, checkered shapes, wave shapes, or honeycomb shapes as illustrated in FIGS. 15A to 15F. Furthermore, these position controllers may be formed in concentric square shapes, concentric polygonal shapes, dot shapes, curved shapes, polygonal shapes, or shapes of arbitrary combinations thereof. Further, these shapes may be applied also to the metalized pattern 21a, the protrusion 22a, the rough surface region 23a, and the spot facing portion 24a of the modification examples of the first embodiment.

Note that the optical element in the third embodiment is the waveguide element 10. However, the optical element may be an etalon filter, a polarized-wave combiner/splitter or the like.

Further, in the first and second embodiments, joint is carried out with one joint material. However, a plurality of joint materials may be used as long as the joint materials are in the non-projection region. Further, the joint material may be positioned in the non-projection region surrounded by the projection region of the ring waveguide or in the non-projection region sandwiched by the projection regions of the arm waveguide.

Further, in the first and third embodiments, the position controller is provided on the substrate. However, the position controller may be provided on the waveguide element or the optical element or may be provided on both of the substrate and the element.

Further, the present disclosure is not limited by the above described embodiments. Those including arbitrary combinations of above described constituent elements are also included in the present disclosure. Further, further effects and modification examples can be easily derived by those skilled in the art. Therefore, broader aspects of the present disclosure are not limited by the above described embodiments, and various changes can be made.

According to an embodiment, an effect that the changes in the optical characteristics of the waveguide element or the optical element caused by the stress from the substrate can be suppressed is exerted.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical module comprising:
    a substrate and
    a waveguide element having a mount face opposed to the substrate, the waveguide element having an interference waveguide portion having an optical interference function; wherein
    the substrate is one of two substrates of a thermoelectric cooling element, the thermoelectric cooling element including the two substrates and a semiconductor which is disposed between the two substrates,
    the mount face includes a projection region to which the interference waveguide portion is projected on the mount face and a non-projection region,
    a whole of the mount face of the waveguide element is uniformly flat and is opposed to a uniform flat face of the substrate,
    the waveguide element is joined to the uniform flat face of the substrate with a joint material only in the non-projection region, and an interval between the uniform flat face of the substrate and the mount face of the waveguide element is formed only by the joint material which is made of an epoxy resin, an acrylic resin, a rubber adhesive agent, or a silicone resin adhesive agent, and
    the waveguide element on the whole of the mount face including the projection region and the non-projection region is thermally controlled by the thermoelectric cooling element.

2. The optical module according to claim 1, wherein the waveguide element is joined to the substrate with the joint material in a region in the non-projection region, the region separated from the projection region by a distance equal to or more than two times a width of a waveguide constituting the interference waveguide portion.

3. The optical module according to claim 1, wherein the waveguide element is a planar lightwave circuit element made of a semiconductor or glass.

4. The optical module according to claim 1, wherein the interference waveguide portion is a ring resonator or a Mach-Zehnder interferometer.

5. The optical module according to claim 1, wherein the substrate or the waveguide element is provided with a position controller configured to position the joint material in the non-projection region.

6. An optical module comprising:
    a substrate and
    an optical element having a mount face opposed to the substrate, the optical element configured to subject input light to a predetermined action and output the light; wherein
    the substrate is one of two substrates of a thermoelectric cooling element, the thermoelectric cooling element including the two substrates and a semiconductor which is disposed between the two substrates,
    the mount face includes a projection region to which an optical path of the light in the optical element is projected on the mount face and a non-projection region,
    a whole of the mount face of the optical element is uniformly flat and is opposed to a uniform flat face of the substrate,
    the optical element is joined to the uniform flat face of the substrate with a joint material only in the non-projection region, and an interval between the uniform flat face of the substrate and the mount face of the waveguide element is formed only by the joint material which is made of an epoxy resin, an acrylic resin, a rubber adhesive agent, or a silicone resin adhesive agent, and
    the waveguide element on the whole of the mount face including the projection region and the non-projection region is thermally controlled by the thermoelectric cooling element.

7. The optical module according to claim 6, wherein the optical element is an etalon filter or a polarized-wave combiner/splitter.

8. The optical module according to claim 6, wherein the substrate or the optical element is provided with a position controller configured to position the joint material in the non-projection region.

\* \* \* \* \*